(12) United States Patent
Kimsal et al.

(10) Patent No.: US 6,194,925 B1
(45) Date of Patent: *Feb. 27, 2001

(54) TIME INTERVAL MEASUREMENT SYSTEM INCORPORATING A LINEAR RAMP GENERATION CIRCUIT

(75) Inventors: Christopher Kimsal, Chanhassen; Jan B. Wilstrup, Moundsview, both of MN (US)

(73) Assignee: Wavecrest Corporation, Edina, MN (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/039,344

(22) Filed: Mar. 13, 1998

Related U.S. Application Data

(60) Provisional application No. 60/039,624, filed on Mar. 13, 1997.

(51) Int. Cl.[7] ................................................. H03K 4/06
(52) U.S. Cl. ................................................. 327/132; 327/95
(58) Field of Search ........................... 327/108, 111, 327/132, 134, 137, 131, 140, 170, 91, 94, 95, 96; 377/20

(56) References Cited

U.S. PATENT DOCUMENTS

| 4,301,360 | 11/1981 | Blair | 377/20 |
|---|---|---|---|
| 4,302,689 | 11/1981 | Brodie | 327/95 |
| 4,323,796 | 4/1982 | Lathrope | 327/93 |
| 4,393,318 | 7/1983 | Takahashi et al. | 327/94 |
| 4,504,155 | 3/1985 | Ruggieri | 368/121 |
| 4,634,993 | 1/1987 | Koen | 330/253 |
| 4,728,813 | * 3/1988 | Diller | 327/132 |
| 4,806,790 | 2/1989 | Sone | 327/94 |
| 4,908,784 | 3/1990 | Box et al. | 702/176 |
| 4,962,325 | 10/1990 | Miller et al. | 327/95 |
| 4,982,350 | 1/1991 | Perna et al. | 702/89 |
| 5,162,670 | 11/1992 | Itakura et al. | 327/93 |
| 5,341,037 | 8/1994 | Miki et al. | 327/96 |
| 5,343,089 | 8/1994 | Itakura et al. | 327/94 |
| 5,352,933 | 10/1994 | Kogan | 327/237 |
| 5,825,218 | * 10/1998 | Colli et al. | 327/112 |

* cited by examiner

Primary Examiner—Timothy P. Callahan
Assistant Examiner—Minh Nguyen
(74) Attorney, Agent, or Firm—Merchant & Gould P.C.

(57) ABSTRACT

A linear ramp generating and control circuit finding particular applicability in a time interval measurement system. The linear ramp circuit includes a hold capacitor which may be linearly discharged during one operating mode of the circuit by coupling a constant current source to the capacitor. The voltage on the hold capacitor is linearly discharged away from a baseline voltage level to a data voltage level which is subsequently passed to an analog-to-digital converter of the time interval measurement system for further processing. The hold capacitor voltage is returned to the baseline voltage level during a recovery mode of circuit operation by a recovery or recharge network. The recharge network may include an active-feedback circuit which implements an approximately second-order voltage response to the hold capacitor during the recovery mode of operation. The circuit may also include a composite amplifier for buffering the hold capacitor voltage level to a circuit output during a hold mode of circuit operation. The effect of this invention is that the errors such as drift, signal noise, and baseline voltage instability can be minimized.

17 Claims, 3 Drawing Sheets

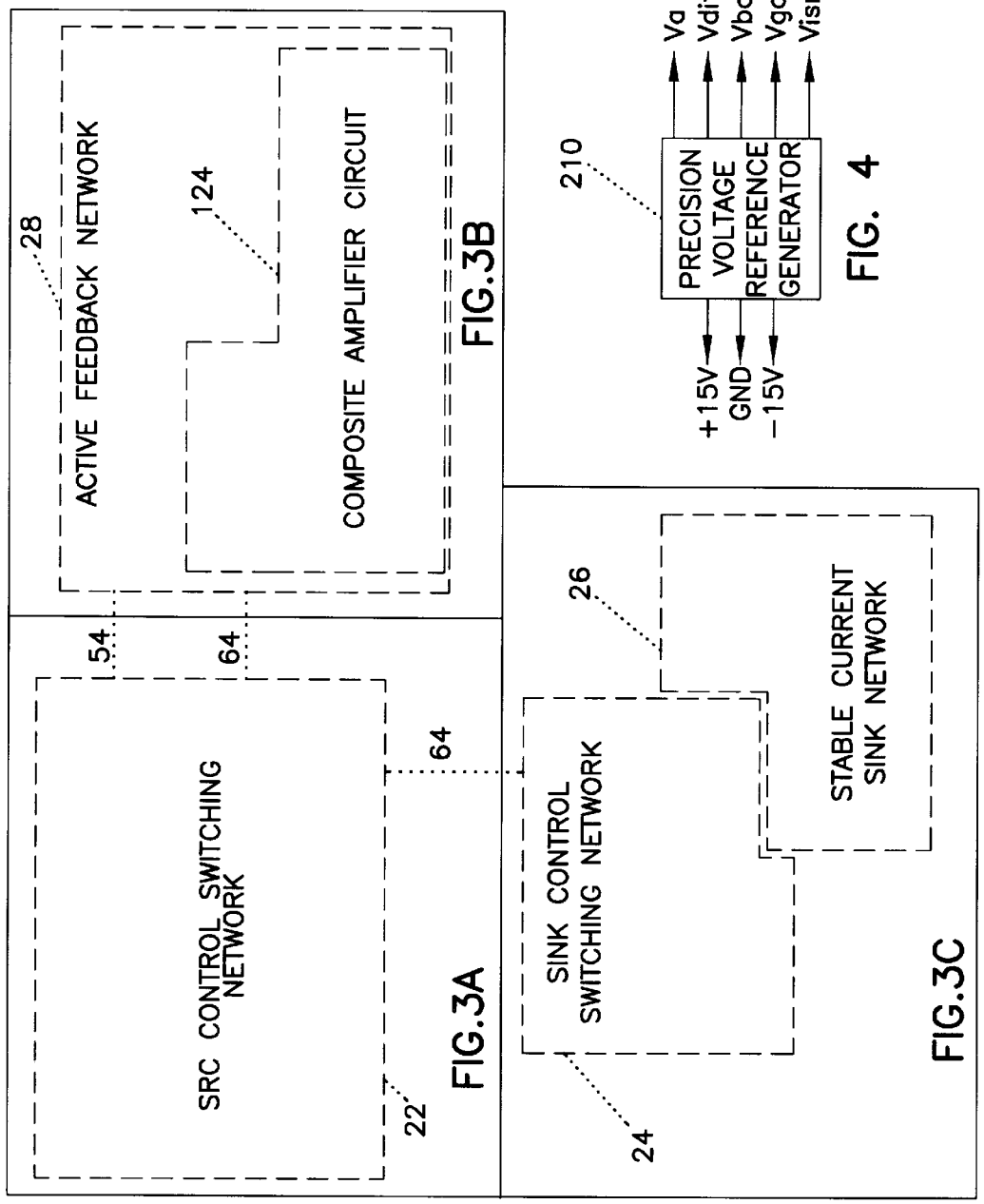

TIME INTERVAL MEASUREMENT SYSTEM INCORPORATING A LINEAR RAMP GENERATION CIRCUIT

CROSS REFERENCE TO RELATED APPLICATION

This application claims the benefit of priority pursuant to 35 USC §119 (e)(1) from the provisional patent application filed pursuant to 35 USC §1 1 1(b) as Ser. No. 60/039,624 on Mar. 13, 1997.

FIELD OF THE INVENTION

The present invention relates to a linear ramp generating and control circuit and in particular, to such a circuit which may be digitally controlled by and for use in association with a time measurement apparatus.

BACKGROUND OF THE INVENTION

The linear ramp generating and control circuit of the present invention finds particular applicability in a measurement apparatus for measuring time intervals between signal events, wherein each measured interval comprises the summation of a coarse clock count and fine or calibrated vernier counts of the measured fractional clock periods after each START and STOP event. Such a time measurement system is disclosed in U.S. Pat. No. 4,908,784 to Box, the entirety of which is herein incorporated by reference. More specifically, the linear ramp circuit of the present invention is an improvement of the linear ramp circuit of the Box '784 device as disclosed in FIGS. 9e–f and accompanying specification. As such, the present invention concerns that portion of the total time measurement apparatus necessary to generate both a rough clock count (course count) and an uncalibrated vernier count (fine count) when provided with START and STOP signals.

As discussed in the Box '784 patent, measurement of calibrated vernier counts of the clock periods or fractional beginning and end times of any event is effectuated with a voltage address developed by associated start and stop ramp capacitive circuitry and passed to an analog to digital converter which is used to access the stored corresponding time value from a calibrated fine count memory. Recharging of the hold capacitor in the Box '784 device was effectuated through a diode clamp network to restore the baseline voltage to the hold capacitor during the recovery mode of operation. Limitations of the diode clamp circuit include relatively poor consistency and lack of repeatability between successive data samples, relatively long time constants of the hold capacitor voltage recovery (requiring increased time interval between data samples to ensure stable voltage levels), and poor thermal dependence (thermal drift).

SUMMARY OF THE INVENTION

It is an object of the present invention to provide a linear ramp generation circuit which decreases errors such as drift, signal noise, and baseline voltage instability.

According to the present invention, there is provided a linear ramp generation circuit adapted to operate sequentially in three modes: a discharge mode when the voltage on a hold capacitor is linearly discharged; a hold mode when the voltage on the hold capacitor is output to an analog-to-digital converter; and a recovery mode when the voltage on the hold capacitor returns to its baseline level prior to the successive measurement cycle. Upon occurrence of a measured signal event, whether a START or STOP event, the circuit of the present invention operatively couples a regulated current sink to the associated hold capacitor in the START/STOP track and hold circuits (data sample or discharge mode). This initiates a linear discharge of the hold capacitor from a base level to a data level, the data level being determined by the time interval that the current sink network is coupled to the hold capacitor. During the hold mode of operation, the data level (capacitor voltage) is subsequently passed to the analog to digital converter and used to calculate the fine count time periods. In turn, the hold capacitor is recharged prior to the next signal event during the recovery phase by an active feedback amplifier network. Discharge of the precision hold capacitors by the regulated current sink network during the discharge or data sample phase of the circuit operation results in a substantially linear discharge of the hold capacitor, the full range of which is defined through calibration to coincide with one master clock cycle period.

One of the linear ramp generator circuits of the present invention is provided for each START and STOP fine count measurement subsystem of the time interval measurement device. Control signals are provided to the START and STOP linear ramp generator circuits of the measurement device, and include SRC (source) and SNK (sink) and their complementary signals. The control signals can be derived directly from the START and STOP event signals and an asynchronous master clock.

In summary, the major operational components of the ramp generator circuit include a SRC (source) control switching network, a SNK (sink) control switching network, a stable current sink network, and an active feedback network for efficient recovery mode operation. The SRC control switching network controls the hold capacitor recharge during the recovery mode of operation by operatively connecting the active feedback network to the hold capacitor. The SRC control switching network includes a differential configured current-steering switch, which may be a pair of emitter-coupled n-p-n type bipolar transistors and associated resistor network. The SNK network controls the discharge of the hold capacitor by coupling and un-coupling the current sink to the hold capacitor during the discharge mode of operation. The SNK network includes a differential current-steering network, which may be a emitter-coupled pair of n-p-n transistors and associated resistor and capacitor network. The constant current sink network is implemented to linearly discharge the hold capacitor during the discharge mode operation. The constant current network includes a base-coupled n-p-n transistor, the base node of transistor being coupled to the output of an op-amp and an associated impedance network. The ramp generator circuit also includes an active feedback network which is operatively connected by the SRC control switching network to the hold capacitor during the recovery mode of circuit operation to recharge the hold capacitor to its baseline voltage. Desirably, the active feedback circuit recharges the hold capacitor through a substantially second-order or near "Bessel"—type response.

Additional objects and advantages of the invention will be set forth in the detailed description which follows when taken in conjunction with the accompanying drawings.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiment given below, serve to explain the principles of the invention wherein:

FIG. 3 illustrates a detailed schematic diagram of the linear ramp generator circuit of the present invention.

FIG. 3A illustrates a source switching network and source control network;

FIG. 3B, in conjunction with FIG. 3A, illustrates a recharge network;

FIG. 3C illustrates a constant current sink control network; and

FIG. 4 illustrates a precision voltage reference generation diagram.

DETAILED DESCRIPTION OF THE PREFERRED EMBODIMENTS

Figure 1:
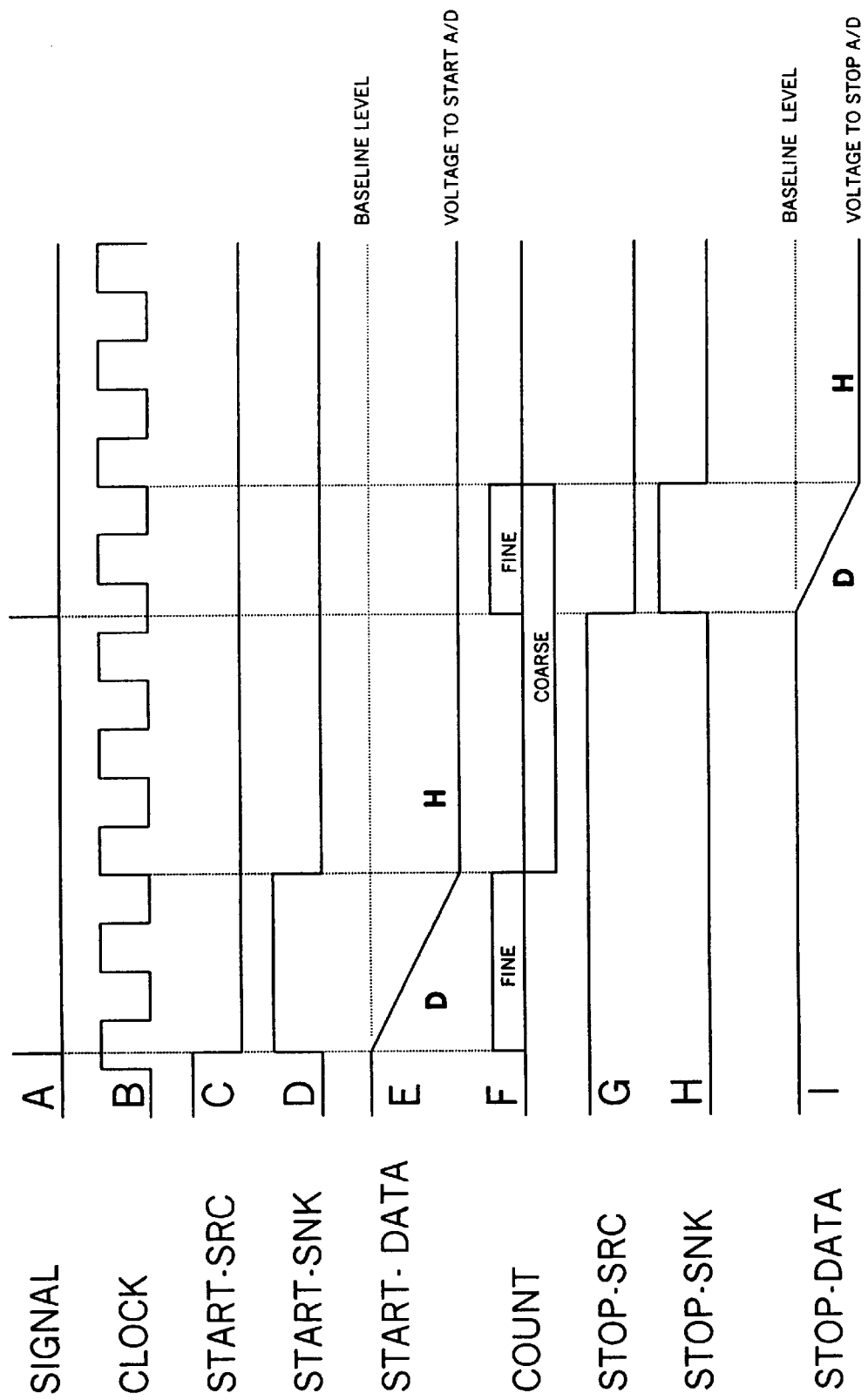
FIG. 1 illustrates a conceptual timing diagram of the operation of a time measurement apparatus incorporating the linear ramp generator circuit of the present invention.

Referring first to FIG. 1, a conceptual timing diagram is shown of the methodology employed by a time interval measurement system incorporating the present invention to measure with picosecond precision either repetitive or non-repetitive events so long as a detectable edge condition is present. One approach of time interval measurement is described in U.S. Pat. No. 4,908,784 to Box, the entirety of which is herein incorporated by reference. As described in Box '784, such a time measurement system divides the interval to be measured into three periods: a coarse count period and START and STOP fine count periods. The coarse count period is comprised of a whole integer number of the clock cycles produced by a precisely calibrated, asynchronous, master clock signal. The fine count periods are each fractional measures of one master clock cycle and are determined relative to time values stored within a calibrated fine count memory (FCM). As will be discussed in more detail hereinafter, the measurement of the fine count periods is achieved by discharging individual hold capacitors 58, as shown in FIG. 3A. In the START and STOP measurement circuitry with a regulated current sink from the beginning of the separately detected START and STOP events until the succeeding second leading edges of the master clock signal. After the occurrence of the leading edge of the clock signal, the attained analog capacitor voltage is passed to an analog-to-digital converter and used to compute a corresponding address for a corresponding time interval stored within the fine count memory. The start and stop fine count measurements are next combined with the course count measurement. The coarse count is obtained in a conventional manner by counting each complete clock cycle for the intervening period. As described, the measurement of the fine count periods is derived from measured analog event values which are converted to digital form and processed via a microprocessor with reference to the FCM.

Still referring to FIG. 1, a number of waveforms A through I are shown which depict in greater detail the operation of the circuitry 10 of FIG. 3. A signal (waveform A) is illustrated as a pair of edge events, the time interval therebetween being of interest. The signal A may be presented on a single channel or obtained between a pair of channels. The master clock signal is shown in waveform B as a series of pulses. Waveform C illustrates the START_SRC (source) signal which transitions from high to low upon the first event of signal A. Waveform D illustrates the START_SNK (sink) signal which transitions from low to high upon the first event of signal A and returns to low upon the second rising edge of the clock signal B. The START_SNK signal D dictates (when high) the discharge of the ramp circuit 10 hold capacitor 58 as illustrated in the START_DATA waveform E. Waveforms G, H, I represent STOP ramp signals, and correspond to the waveforms C, D, E of the START ramp signals described above. The COUNT data depicted as waveform F includes the START and STOP fine count intervals and the coarse count interval. Thus, as described above waveforms D and H illustrate the ramp start and stop control signals (SNK and SRC) which can be directly derived from the START and STOP event signals and an asynchronous master clock. Waveforms E and I represent hold capacitor 58 voltage levels during the fine count discharge mode (D) and hold mode (H).

Figure 2:
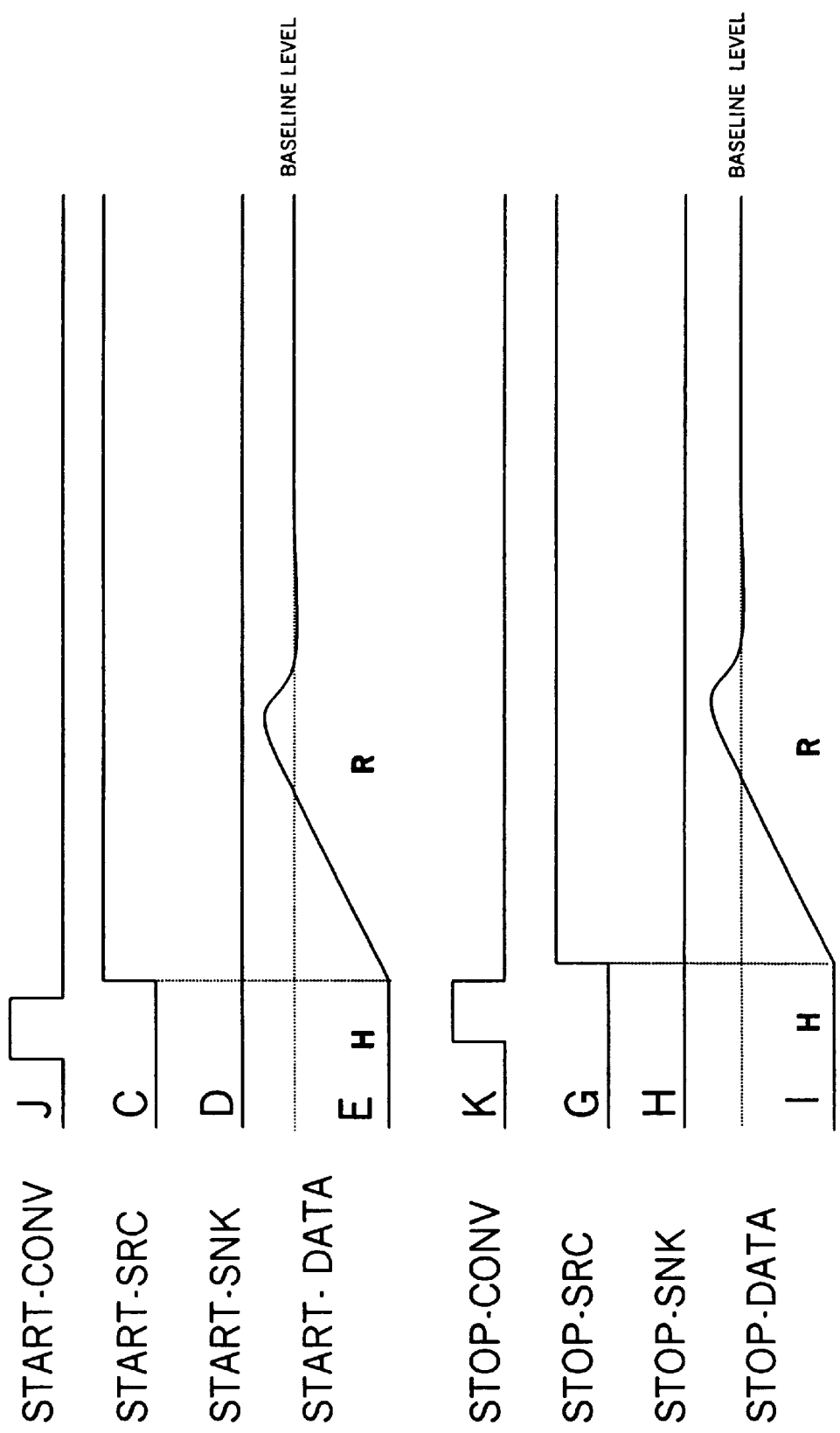
FIG. 2 illustrates a continuation of the conceptual timing diagram of FIG. 1.

Referring now to FIG. 2, the operation of the ramp generator circuit 10 in the hold mode (H) and recover mode (R) is illustrated. FIG. 2 illustrates a continuation of the timing diagram of FIG. 1, though the time scale of FIG. 2 is approximately double in order of magnitude (time expanded) as compared to FIG. 1. Waveforms J and K represent the control signal for the analog to digital conversion process of the data at the circuit's 10 start and stop DATA output terminals 20. With reference to waveforms E and I, the analog-to-digital conversion occurs during the hold mode (H) of operation and prior to the capacitor 58 recharge during recovery mode (R). Waveforms C and G are START_SRC and STOP_SRC signals which activate the recharge of the hold capacitors 58 to baselines level during the recovery mode (R). Upon occurrence of a measured signal event, whether a START or STOP event, the circuit of the present invention operatively couples a regulated current supply to the associated hold capacitor 58 in the START or STOP track and hold circuits (data sample mode). This initiates a linear discharge of the hold capacitors 58 from a baseline voltage level to a data voltage level, the data voltage level being determined by the time interval that the current sink network 26 is coupled to the hold capacitor 58. During the hold mode (H) of operation, the data voltage level is subsequently passed to the analog-to-digital converter and used to calculate the fine count time periods. In turn, the hold capacitors 58 are recharged prior to the next signal event during the recovery phase (R) by an active feedback amplifier structure 28, as will be discussed hereinafter. Discharge of the precision hold capacitor 58 by the regulated current sink network 26 during the discharge or data sample phase (D) of the circuit operation results in a substantially linear discharge of the hold capacitor 58, the full range of which is defined through calibration to coincide with one master clock cycle period. When using a hold capacitor 58 in this manner to generate a ramp by coupling and uncoupling a current sink, it is appreciated that deleterious effects of charge injection caused by switching transients should be minimized. The present circuit limits charge injection effects by operating the hold capacitors 58 from a single baseline voltage level. In contrast, the Box '784 ramp generator circuit provided a pair of baseline levels, the capacitor first discharging from a level near ground to a voltage $V_{BIAS}$, then charging the capacitor until the next master clock edge. To further limit the charge injection effects, the ramp generator circuit of the present invention requires only two control signals (SRC and SNK) instead of the three control signals required in Box '784.

Referring now to FIGS. 3 and 4, the digital logic-controlled discharge, hold and recovery circuit 10 (or linear ramp generator circuit) will be described in detail. FIG. 4 schematically depicts a precision voltage reference generation network 210 supplied to the circuit 10 of FIG. 3. Referring particularly to FIG. 3, one of these ramp generator circuits 10 is provided for each of the START and STOP fine count time measurement subsystems. Control signals into ramp generator circuit include SRC and SNK and their complementary signals provided at nodes 12 and 14 (FIG. 3A) and 14 and 16 (FIG. 3B). The output signal, DATA is operatively connected to an analog to digital converter (not shown) at node 20 for subsequent fine count processing. Major operational components of the ramp generator circuit include a SRC control switching network 22, a SNK control switching network 24, a stable current sink network 26, and an active feedback network 28 for efficient recovery mode operation.

Still referring to FIG. 3, the SRC control switching network 22 includes a differential configured current-steering switch, which may be a pair of emitter-coupled n-p-n type bipolar transistors 30, 32 and associated resistor network 34, 36, 38, 40, 42, 44, 46, 48, 50, 52. The differential switch network is operatively connected to the SRC control signal and its complementary signal SRC_BAR, provided at nodes 12, 14. More particularly, the base nodes of the transistors 30,32 are coupled to control nodes 12 and 14, respectively, where a control signal SRC and the complementary control signal SRC_BAR respectively appear. During the discharge and hold modes of operation of the ramp generator circuit 10, the SRC control switching network 22 with transistor 30 conducting, maintains the voltage at node 54 at a level which prevents transistor 56 from conducting. When the ramp generator circuit 10 transitions into its recovery mode of operation (the SRC control signals 12 transition L-H), the transistor 32 conducts, and the voltage level at node pair 12, 14 permits transistor 56 to conduct, and hence allows recharge of the hold capacitor 58 to its baseline voltage level. SRC control switching network 22 further includes a pair of ramp control transistors 60 and 62 which are coupled to the collector node of transistor 32. Ramp control transistors 60, 62 control a current return path during the recovery phase of circuit 10 operation. During recovery mode, with transistor 32 conducting and transistor 60 in cut-off mode, current from the active feedback recovery circuit 28 is conducted along a return path at node 64 through resistor 67, transistor 62 and resistor 68. During data sample and hold modes of operation, with transistors 30 and 60 conducting and transistor 62 in cut-off, a high impedance is presented at node 64 with respect to the collector of transistor 62. As a result, SRC control network 22 effectively directs the recharging of the hold capacitor 58 during the recovery mode of circuit 10 operation and otherwise isolates node 64 with relatively high impedances.

The ramp generator circuit 10 of the present invention includes a SNK network 24 for controlling the discharge of the hold capacitor 58. SNK network 24 includes a differential current-steering network, which may be an emitter-coupled pair of n-p-n transistors 66, 68 and associated resistor and capacitor network 70–96 as shown in FIG. 3C. The base nodes of the transistors 66, 68 are coupled to control nodes 16 and 18, respectively, where a control signal SNK and the complementary control signal SNK_BAR respectively are provided. The emitter nodes of the transistors 66, 68 are commonly coupled to the input node of the constant current sink network 26. Current provided by the constant current sink network 26 is conducted either through transistor 66 or transistor 68, depending on the value of the SNK control signals 16,18. As a result, SNK signals 16, 18 effectively direct the route of current flow provided by the constant current sink network 26, either through transistor 66 during the hold and recovery modes of ramp generator circuit 10 operation, or through transistor 68 during the discharge mode of operation which, as will be described herein, linearly discharges the hold capacitor 58. In sum, the SNK network 24 operatively connects the constant current sink network 26 to the hold capacitor 58 during the discharge mode of operation, and otherwise presents a high impedance at node 64 during the hold and recovery modes of operation.

Still referring to FIG. 3, the ramp generator circuit 10 of the present invention includes a constant current sink network 26 for linearly discharging the hold capacitor 58 during the data sample mode of circuit 10 operation. Constant current network 26 includes a base-coupled n-p-n transistor 98, the base node of transistor 98 being coupled to the output of op-amp 100 through resistors 102,104. A feedback network is operatively connected between the op-amp 100 and its inverting and non-inverting terminals including resistors 102–110 and capacitors 112, 114 as shown in FIG. 3C. The magnitude of the current drawn drawn from hold capacitor 58 may be calibrated with gain set pot 116 which is connected between reference voltage $V_{gain}$ and the inverting input terminal of the op-amp 100. As described earlier, the constant current provided by the current network 26 is conducted either through transistor 66 or transistor 68 as controlled by the SNK control network 24.

Another component of the ramp generator circuit 10 is the active feedback network 28 which is operatively connected to the hold capacitor 58 during the recovery mode of circuit 10 operation to recharge the hold capacitor 58 to its baseline voltage. As described earlier, the active feedback network 28 of the present invention is operatively coupled by the SRC control network 22 to the hold capacitor 58 during the recovery phase of operation to recharge the capacitor 58 to its baseline voltage level prior to the successive data sample. The active feedback network 28 recharges the hold capacitor 58 through a substantially second-order response (near "Bessel"—type transfer function) as illustrated in FIG. 2 in the recovery mode (R) of circuit 10 operation. The second-order response of the capacitor voltage during recovery being obtained through proper selection of circuit capacitive and resistive components as one skilled in the art will appreciate. Active feedback network 28 includes an op-amp 118 operatively connected through its output terminal to hold capacitor 58 during recovery mode of operation as directed by SRC control circuit 22. Op-amp 118 is provided in a closed-loop inverting configuration as the output terminal is connected through a feedback network including capacitor 120 and resistor 122 to the inverting input terminal. A diode configured transistor 149 is also connected between the op-amp 118 output and its inverting input terminal. This transistor 149 improves circuit performance by preventing op-amp 118 from saturating during the discharge and hold modes of circuit 10 operation. The voltage baseline level of the circuit 10 is calibrated with baseline pot 125 which is connected between the reference voltage $V_{base}$ and the inverting input of op-amp 118. An Analog Devices, Inc, Model AD829 op-amp provides suitable performance characteristics, e.g. gain, noise, operating speed, etc.

Yet another component of the active feedback control circuit 28 is a composite amplifier network 124. Composite amplifier circuit 124 operatively buffers the voltage level of the hold capacitor 58 to the DATA output node 20 during the hold mode of circuit 10 operation and presents a high impedance with respect to the gate node of FET 126. As illustrated, composite amplifier circuit 124 may include a FET differential pair front end 126,128. The gate of FET 126 is connected to the hold capacitor 58 through resistor 127. The source nodes of the coupled FET pair 126, 128 are connected to current source 130. Drain node of FET 126 is connected to the inverting input terminal of op-amp 132, while drain node of FET 128 connects to the non-inverting terminal of op-amp 132. The FET differential pair 126, 128 is provided in a single component package, with transistors 126,128 matched for gain, offset, drift, etc. A Temic, Inc, Model SST441 component provides suitable performance characteristics (combination of low noise, low leakage and high speed). Output of the op-amp 132 is connected both to the analog ramp output of the circuit 10 at node 20 and to the inverting input terminal of op-amp 118 through resistor 134. Operationally, the FET-based composite amplifier 124 presents a high impedance at node 64 and thus substantially limits the extent of leakage current from hold capacitor 58 which may influence data samples. The performance of the active feedback control circuit 28 importantly depends on the performance characteristics (noise, gain, operating speed, etc.) of the op-amps 118 and 132 and associated resistive and capacitive components. Applicant has found that Analog Devices, Inc, Model AD829 op-amp provides suitable performance characteristics.

Referring again to FIG. 4, the precision voltage reference generation 210 network is illustrated. Selection of such a network 210 is readily appreciated by those skilled in the art. Inputs to the network 210 include +15V, −15V and ground. Precision output voltage levels include $V_a$, $V_{diff}$, $V_{base}$, $V_{gain}$, and $V_{sink}$. Exemplary values for $V_a$, $V_{diff}$, $V_{base}$, $V_{gain}$, and $V_{sink}$ are: −5V, 8V, −1.2V, −11.2V, and −10V, respectively.

Exemplary values for the resistors of the ramp generator circuit of the present invention are indicated in Table 1.

TABLE 1

| RESISTOR NO. | RESISTANCE (ohms) |
| --- | --- |
| 34 | 150 |
| 36 | 1.5K |
| 38 | 1.5K |
| 40 | 274 |
| 42 | 274 |
| 44 | 100 |
| 46 | 100 |
| 48 | 100 |
| 50 | 100 |
| 52 | 2.15K |
| 55 | 13K |
| 67 | 100 |
| 68 | 10K |
| 70 | 10 |
| 72 | 43.2 |
| 74 | 43.2 |
| 76 | 43.2 |
| 78 | 10 |
| 80 | not installed |
| 82 | 150 |
| 84 | 150 |
| 88 | 150 |
| 90 | 150 |
| 92 | not installed |
| 104 | 1K |
| 106 | 0 |
| 108 | 4.02K |
| 110 | 50 |
| 116 | 1K pot |
| 117 | 2.49K |
| 122 | 12.1K |
| 123 | 1K |
| 125 | 1K pot |
| 127 | 49.9 |

TABLE 1-continued

| RESISTOR NO. | RESISTANCE (ohms) |
| --- | --- |
| 134 | 9.68K |
| 136 | 100 |
| 138 | 100 |
| 140 | 1K |
| 144 | 1K |
| 146 | 1.27K |
| 150 | 7.5K |
| 152 | 1K |
| 154 | 100 |

Exemplary values for the capacitors of the ramp generator circuit of the present invention are indicated in Table 2.

TABLE 2

| CAPACITOR NO. | CAPACITANCE (farads) |
| --- | --- |
| 58 | 112 pf |
| 86 | 0 pf |
| 94 | 0 pf |
| 96 | 0 pf |
| 112 | .1 µf |
| 114 | 2000 pf |
| 120 | 68 pf |
| 148 | 1000 pf |

Although particular embodiments of the present invention have been shown and described, it will be obvious to those skilled in the art that various changes and modifications may be made without departing from the spirit and scope of the present invention. For instance, the circuit 10 may be implemented such that during the ramp mode, the hold capacitor 58 voltage can be increasing while during the recovery mode the capacitor 58 voltage is discharged to return to a baseline voltage level. From the foregoing description of the preferred embodiments

What is claimed is:

1. A linear ramp generation circuit operating in a recovery mode, a ramp mode, or a hold mode, said circuit comprising:

an output node;

a first input node coupled to an externally provided first input signal;

a second input node coupled to an externally provided second input signal;

a constant current source network;

a capacitor having a first node and a second node, the first node being maintained at a circuit reference level, the second node being coupled to the output node at least during the hold mode of operation;

a return charge network for returning a voltage on the capacitor to a baseline level during the recovery mode, the return charge network including an active negative feedback circuit which exhibits analog behavior for regulating the voltage on the capacitor;

a first switch means responsive to the first input signal for connecting the second node of the capacitor to the constant current source network during the ramp mode of operation and changing the voltage on the capacitor away from the baseline level, and for uncoupling the second node of the capacitor from the constant current source network during the hold mode and recovery mode of operation; and a second switch means responsive to the second input signal for connecting the second node of the capacitor to said return charge network during the recovery mode of operation to return the voltage on the capacitor to the baseline level, and for uncoupling the second node of the capacitor from the return charge network during the ramp mode and hold mode of operation.

2. A linear ramp generation circuit of claim 1, wherein the return charge network recharges the capacitor during the recovery mode of operation.

3. A linear ramp generation circuit of claim 1, wherein the active negative feedback circuit implements an approximately second-order voltage response to the capacitor during the recovery mode of operation.

4. A linear ramp generation circuit of claim 1, wherein the output node is coupled to the second node of the capacitor through a composite amplifier including a FET pair and an op-amp.

5. A linear ramp generation circuit of claim 1, wherein the first node of the capacitor is at a circuit ground reference voltage.

6. A linear ramp generation circuit of claim 1, wherein the constant current source network includes an op-amp.

7. A linear ramp generation circuit of claim 1, wherein the first and second switch means are differential-paired transistors.

8. A linear ramp generation circuit of claim 1, wherein the return charge network includes an op-amp and an associated impedance feedback network.

9. A linear ramp generation circuit operating in a discharge mode, a hold mode, or a recovery mode, said circuit comprising:
   a first input node and a second input node for receiving a first input signal and a second input signal, respectively;
   an output node;
   a constant current source network;
   a recharge network including an active negative feedback circuit which exhibits analog behavior, the recharge network having a first recharge node and a second recharge node, the first recharge node connected to the output node;
   a capacitor having a first capacitor node and a second capacitor node, the first capacitor node being maintained at a circuit reference level, and the second capacitor node being coupled to the output node at least during the hold mode of operation;
   a first transistor switch responsive to the first input signal for connecting the second capacitor node to the constant current source network during the discharge mode of operation and for uncoupling the second capacitor node from the constant current source network during the hold mode and recovery mode of operation; and
   a second transistor switch responsive to the second input signal for connecting the second capacitor node to the second recharge node during the recovery mode of operation and for uncoupling the second capacitor node from the second recharge node during the discharge mode and hold mode of operation.

10. A linear ramp generation circuit of claim 9, wherein the active negative feedback circuit implements an approximately second-order voltage response to the capacitor during the recovery mode of operation.

11. A linear ramp generation circuit of claim 9, wherein the constant current source network is a current sink for linearly discharging the capacitor during the discharge mode of operation.

12. A linear ramp generation circuit of claim 9, wherein the first capacitor node is at a circuit ground reference voltage.

13. A linear ramp generation circuit of claim 9, wherein the first transistor switch and second transistor switch are differential-paired transistors.

14. A linear ramp generation circuit of claim 9, wherein the recharge network includes an op-amp and an associated impedance feedback network.

15. A linear ramp generation circuit of claim 9, wherein the output node is coupled to the second capacitor node through a composite amplifier including a FET pair and an op-amp.

16. A method of sequentially operating a linear ramp generation circuit, said method comprising the steps of:
   upon the occurrence of a first input signal, discharging a capacitor having a first node and a second node from an initial baseline voltage level by connecting a constant current source network to the second node of the capacitor, said first node being maintained at a circuit reference level;
   upon the occurrence of a second input signal, disconnecting the second node of the capacitor from the constant current source network;
   maintaining the second node of the capacitor at a high impedance during a hold period after the occurrence of the second input signal;
   connecting the second node of the capacitor during the hold period to an output node;
   upon the occurrence of a third input signal, connecting the second node of the capacitor to a recovery network including an active negative feedback circuit which exhibits analog behavior for recharging the capacitor back to the baseline voltage level; and
   upon the occurrence of a fourth input signal, disconnecting the first node of the capacitor from the recovery network prior to a succeeding first input signal.

17. The method of claim 16, further comprising the step of:
   upon the occurrence of the third input signal, coupling the second node of the capacitor through a composite amplifier including a FET pair and an op-amp.

\* \* \* \* \*

UNITED STATES PATENT AND TRADEMARK OFFICE
CERTIFICATE OF CORRECTION

PATENT NO. : 6,194,925 B1
DATED : February 27, 2001
INVENTOR(S) : Kimsal et al.

It is certified that error appears in the above-identified patent and that said Letters Patent is hereby corrected as shown below:

Drawings,
Sheet 4 of 6, insert omitted Fig. 3A

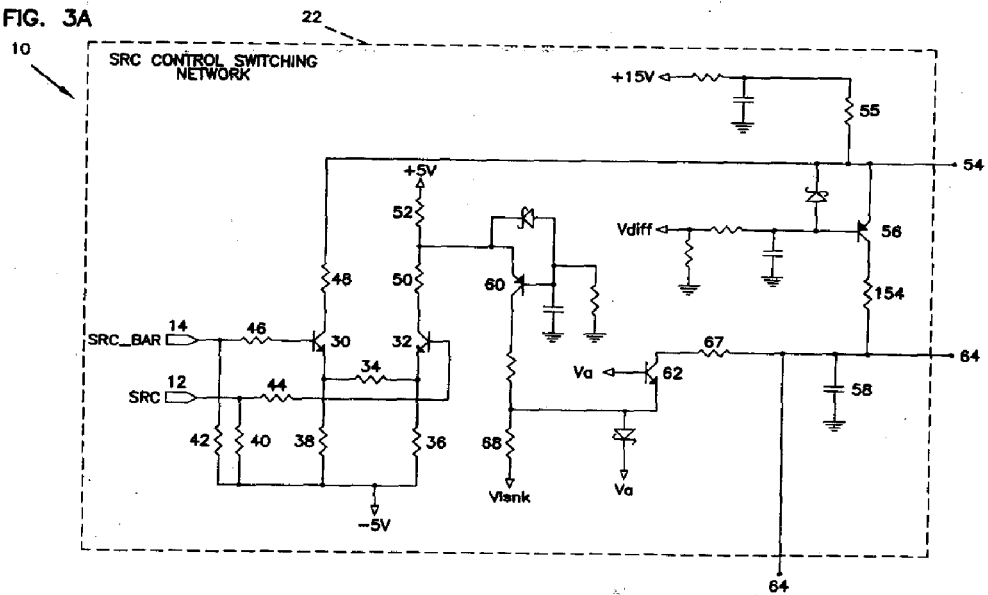

Sheet 5 of 6, insert omitted Fig. 3B

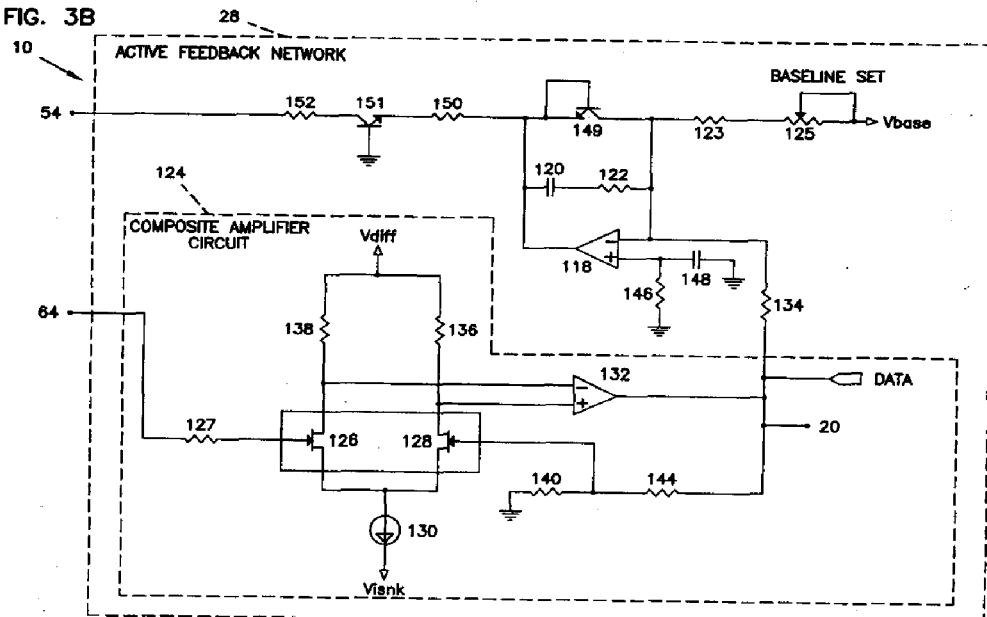

UNITED STATES PATENT AND TRADEMARK OFFICE
CERTIFICATE OF CORRECTION

PATENT NO. : 6,194,925 B1
DATED : February 27, 2001
INVENTOR(S) : Kimsal et al.

It is certified that error appears in the above-identified patent and that said Letters Patent is hereby corrected as shown below:

Drawings (cont'd),
Sheet 6 of 6, insert omitted Fig. 3C

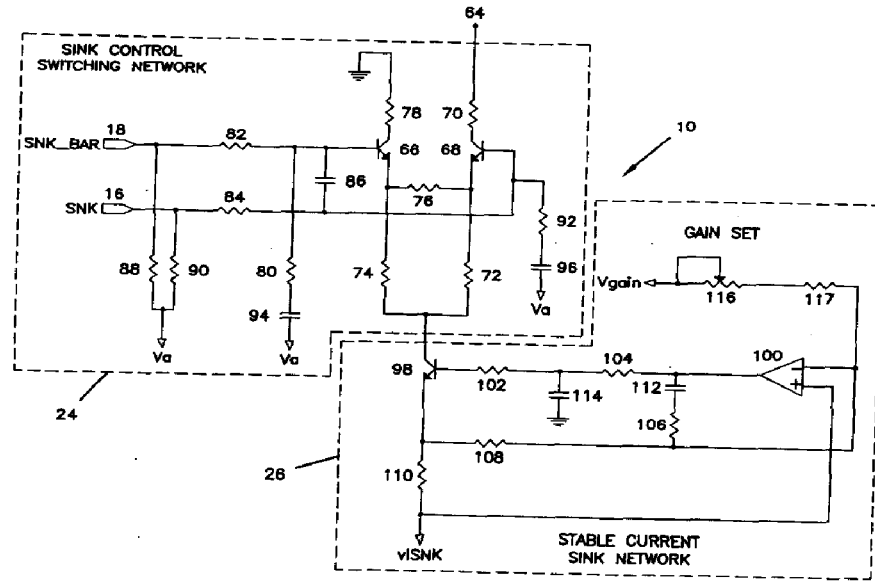

Column 3,
Line 9, "present invention." should read -- present invention; --
Lines 41-42, "capacitors 58," should read -- capacitor 58, --
Line 42, "FIG. 3A. In" should read -- FIG. 3A, in --

Column 6,
Line 21, "current drawn drawn from" should read -- current drawn from --

Signed and Sealed this

Seventh Day of June, 2005

JON W. DUDAS
*Director of the United States Patent and Trademark Office*